United States Patent
Kuivalainen

(10) Patent No.: US 9,367,788 B2
(45) Date of Patent: Jun. 14, 2016

(54) ARRANGEMENT FOR CONNECTING SET VALUES CONCERNING PERFORMANCE TO AN ELECTRONICS DEVICE

(71) Applicant: VACON OYJ, Vaasa (FI)

(72) Inventor: Janne Kuivalainen, Helsinki (FI)

(73) Assignee: VACON OYJ, Vaasa (FI)

( * ) Notice: Subject to any disclaimer, the term of this patent is extended or adjusted under 35 U.S.C. 154(b) by 0 days.

(21) Appl. No.: 14/602,779

(22) Filed: Jan. 22, 2015

(65) Prior Publication Data

US 2015/0206041 A1    Jul. 23, 2015

(30) Foreign Application Priority Data

Jan. 23, 2014    (FI) ..................................... 20145066

(51) Int. Cl.
| | | |
|---|---|---|
| *G06F 17/00* | (2006.01) | |
| *G06K 15/00* | (2006.01) | |
| *G06K 7/08* | (2006.01) | |
| *G06K 19/077* | (2006.01) | |
| *G06K 19/073* | (2006.01) | |
| *G06F 12/14* | (2006.01) | |
| *H05K 7/14* | (2006.01) | |

(52) U.S. Cl.
CPC ........ *G06K 19/0772* (2013.01); *G06F 12/1408* (2013.01); *G06K 19/073* (2013.01); *H05K 7/1432* (2013.01); *G06F 2212/1052* (2013.01)

(58) Field of Classification Search
USPC .......................... 235/375, 451, 492, 383, 385
See application file for complete search history.

(56) References Cited

U.S. PATENT DOCUMENTS

| | | | | |
|---|---|---|---|---|
| 2004/0098157 A1* | 5/2004 | Sabini | ..................... | G06Q 10/10 700/115 |
| 2008/0151134 A1* | 6/2008 | Huang | ................ | G02F 1/13306 349/25 |
| 2008/0263080 A1* | 10/2008 | Fukuma | ................. | G06Q 10/00 |
| 2009/0113311 A1* | 4/2009 | Fried | ........................ | G06Q 10/10 715/753 |
| 2009/0172979 A1* | 7/2009 | Kaoh | ......................... | G09F 9/33 40/447 |
| 2010/0079250 A1* | 4/2010 | Fukushima | ............. | G06F 21/35 340/10.1 |
| 2010/0113163 A1* | 5/2010 | Yang | ........................ | G07F 17/32 463/43 |
| 2011/0066865 A1* | 3/2011 | Bandholz | ................ | G06Q 90/00 713/300 |
| 2011/0085287 A1* | 4/2011 | Ebrom | .................... | G08C 17/02 361/679.01 |
| 2012/0249339 A1* | 10/2012 | Hanley | .................... | G06Q 50/06 340/870.02 |
| 2013/0037617 A1* | 2/2013 | Weakley | ............ | G06K 19/0723 235/492 |
| 2013/0140371 A1* | 6/2013 | Omura | ............. | G06K 19/07786 235/492 |
| 2014/0151587 A1* | 6/2014 | LaFountain | .......... | G05B 19/042 251/129.01 |

\* cited by examiner

*Primary Examiner* — Tuyen K Vo
(74) *Attorney, Agent, or Firm* — Birch, Stewart, Kolasch & Birch, LLP

(57) ABSTRACT

Arrangement for connecting set values concerning performance relating to an electronics device to the electronics device, more particularly to a power electronics device, such as a frequency converter, which arrangement includes a rating plate part. The rating plate part is a separate unit belonging to the nameplate arrangement of the electronics device, which unit may be affixed to the electronics device. The rating plate part includes a memory member, in which values concerning the performance of the device are recorded. The rating plate part further includes an area in which information corresponding to the information recorded in the memory member is printed and which area remains visible when the rating plate part is affixed to the electronics device.

20 Claims, 2 Drawing Sheets

Figure 1:
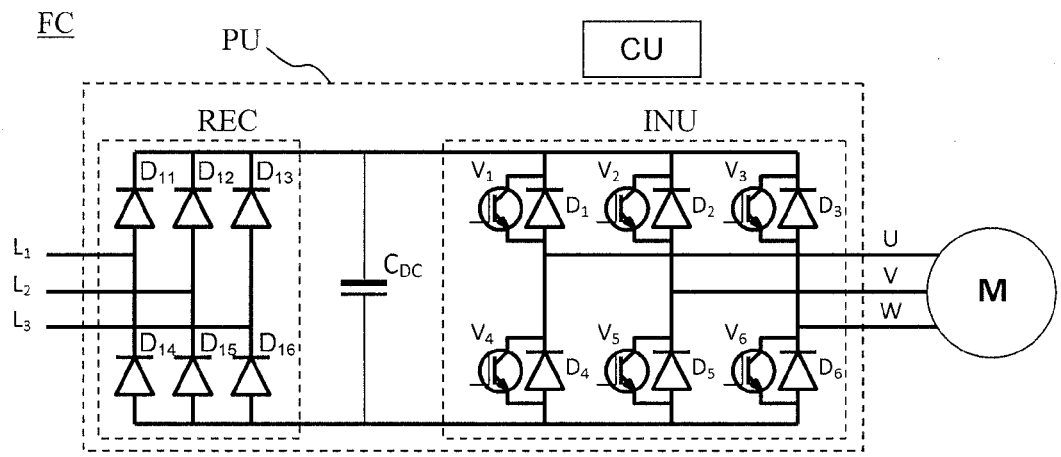

ARRANGEMENT FOR CONNECTING SET VALUES CONCERNING PERFORMANCE TO AN ELECTRONICS DEVICE

FIELD OF TECHNOLOGY

The object of this invention is an arrangement for connecting set values concerning performance to an electronics device, i.e. a configuration arrangement for the device. More particularly the object of the invention is a configuration arrangement for a power electronics device, such as for a frequency converter.

BACKGROUND OF THE INVENTION

Typical applications of frequency converters are electric motors and devices for producing renewable energy over a wide output power range and voltage range (generally below 1 kW ... over 1 MW and 230 VAC ... 690 VAC). For covering these requirements it is necessary to design and manufacture a number of devices intended for different output powers because one single device construction is not technically or economically a reasonable option.

It is not, however, economically reasonable to optimize a device construction dedicated to each motor output power of each voltage range, but instead a typical method is to design and manufacture a plurality of device constructions (frames), each of which covers its own specific performance range. The performance values are generally indicated at least as a rated current value and as a voltage class.

It is economically advantageous to set a sales price for each output power and voltage separately, because e.g. frequency converters have a number of applications for which the price obtained from sold devices is determined according to both the market area and the product properties. This results in the current values and voltage values implemented by one frame being productized for the market as different and parallel product names. Productization typically takes place by varying the current values and/or voltage values possible for the frame either by adapting the physical structure of the product and/or with software-based adjustments, as well as by enabling or preventing the use of various optional extras.

Since current values and voltage values belong to the description of the essential information about an electrical device, these values must be recorded on the nameplate of a product in accordance with the requirements of international safety standards, such as e.g. IEC 60204-1 and IEC 61439-1. The nameplate must be affixed to the device in a reliable manner and the plate must remain legible in the operating conditions defined for the device.

Use of the same device construction for manufacturing a number of different products delivers economic advantages in the production phase of subassemblies, because there are fewer structures to be produced and structure-specific volumes are therefore larger. The advantages achieved in manufacture diminish, however, in final assembly, outfitting, distribution and servicing activities, because the current values and voltage values according to the sales range, as well as possible product variants, increase the number of items to be maintained and stored, which in turn results in the product distribution stage in the value of inventories tending to rise and inventory turnover tending to fall.

Efforts have been made to solve the problem e.g. with various software keys, the distribution and sales of which is, however, difficult owing to sales chains comprising numerous different agents. In addition, variation of current values and voltage values is not, however, possible merely with software because the nameplate must correspond to the configuration of the device.

SUMMARY OF THE INVENTION

The purpose of this invention is to achieve a new type of arrangement, with which the aforementioned drawbacks are avoided. This aim is achieved with the nameplate arrangement according to the invention, which is characterized by what is stated in the characterization part of the independent claim. Other preferred embodiments of the invention are the objects of the dependent claims.

The basic concept of the invention is that the part of the nameplate defining the rated performance of a device is a mechanically separate unit, which can be permanently fixed to the device in a late phase, e.g. during commissioning. In this document this type of unit is designated a "rating plate part", and it can be e.g. a module mechanically matched to the device frame or a strip-shaped microchip comprising a remotely readable sticker, which is glued to be a part of the nameplate of the device. The rating plate part contains information about the performance of the device, both as data recorded in the memory means and as data stamped to be permanently visible, which remains visible and can be read in the operating conditions defined for the device as is required in the safety standards applicable to the device.

According to one embodiment of the invention the rating plate part contains a memory means and a communication means for digital data transfer, said communication means corresponding to the communication means disposed in the device frame. The data transfer can be wireline or wireless.

According to one embodiment of the invention a device, in connection with which a rating plate part has been disposed, comprises a communication means with which the information contained by the rating plate part can be read. Used in the data transfer according to the invention is an encryption algorithm, which prevents the reading of the data with communication means other than those belonging to the system.

According to one embodiment of the invention a device, in connection with which a rating plate part has been disposed, can adjust its own performance values to be permanently according to the definitions it reads from the rating plate part.

The invention enables technically and economically advantageous distribution of one frame, if necessary right up to the final customer, in such a way that the final adjustment of current values and voltage values, and also the productization of the device, occurs in the desired phase after the manufacture of the device. A functional device assembly is formed from a combination of the device itself and a means, i.e. a rating plate part, containing the performance definition of the device. The device and the means containing the device definition can be delivered and sold either as a pre-combined item or as two separate items.

It is economically advantageous to keep inventory values low and inventory turnover speeds high also in the distribution of products. According to the invention it is possible to productize a device as close as possible to the customer delivery, which furthers these aims and is suitable for shortening delivery times.

SHORT DESCRIPTION OF THE DRAWINGS

Figure 2:
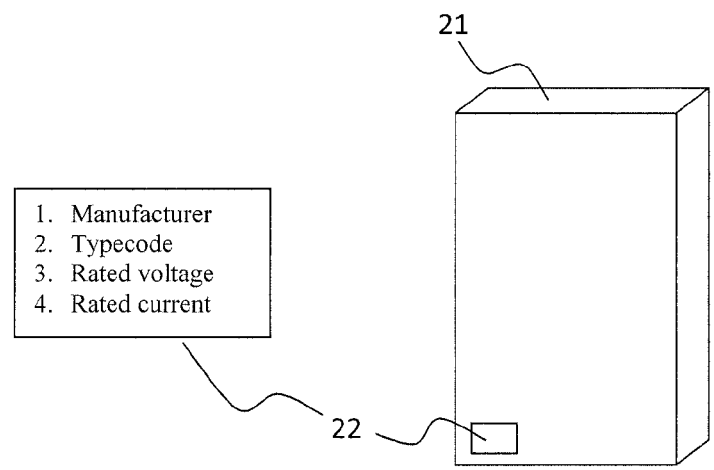
Figure 3:
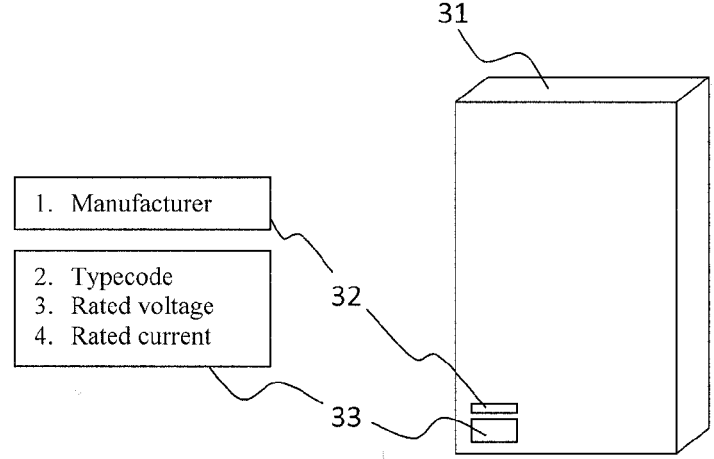

In the following, the invention will be described in more detail by the aid some embodiments with reference to the attached drawings, wherein FIG. 1 presents the main circuit of a frequency converter, FIG. 2 describes a nameplate solution according to prior art, FIG. 3 presents a nameplate solution according to the invention, and FIGS. 4a, 4b and 5 describe practical embodiments of nameplate solutions according to the invention.

DETAILED DESCRIPTION OF THE INVENTION

The figures illustrating the invention are presented in simplified form for highlighting the essential features of the invention, e.g. without all the information belonging to a nameplate or without the fixing arrangements of mechanical parts, which are otherwise obvious to a person skilled in the art.

FIG. 1 presents the simplified main circuit of a possible application, a frequency converter, of the invention. The frequency converter FC, which comprises a power unit PU and a control unit CU, converts the fixed voltage of the supply network connected to the input connectors $L_1 \ldots L_3$ into output voltage U, V, W that is adjustable in its frequency and its amplitude, for adjusting the speed of rotation of a motor M.

The power unit PU comprises a rectifying bridge REC composed of six diodes $D_{11} \ldots D_{16}$, a capacitor unit $C_{DC}$ filtering the direct-current voltage of the intermediate circuit, and also six controllable power switches $V_1 \ldots V_6$ and an inverter bridge composed of diodes $D_1 \ldots D_6$ connected in parallel with said power switches. The control unit CU, which can be a mechanically separate module or integrated into the other mechanics of the frequency converter, controls the power switches of the inverter in the appropriate manner for forming the desired output voltage.

The dimensioning of the main components of the power unit and of the cooling arrangements and mechanical parts depends on the performance values of the device, but for practical reasons a power unit of the same size is used with a number of rated device output powers. The control unit is typically specific to a product family, i.e. the same over a wide power range.

FIG. 2 describes a device 21, to which is affixed a nameplate 22. Safety standards require that a nameplate must be affixed in a permanent manner in a visible location and that from it inter alia the following must be evident: the manufacturer of the device (1. Manufacturer), the type marking (2. Typecode) and the more important performance values (3. Rated voltage and 4. Rated current). The nameplate can be an adhesive sticker, on which the desired information is written after the performance values of the device have been set in the manufacturing process. A performance value, e.g. the rated current of the device, with which devices having different rated output powers are distinguished from each other, can be just a parameter value set in the memory of the control unit. In this type of case the only outwardly visible physical difference between two devices having different rated output powers is the stamping on the nameplate.

FIG. 3 describes a device 31, in which is a nameplate arrangement according to this embodiment of the invention. The nameplate is of two parts in such a way that the part 32 contains the type of information remaining permanent that does not depend on the performance values of the device, such as the name of the manufacturer (1. Manufacturer). The second part 33 of the nameplate, for which the designation "rating plate part" is used in this document, contains information indicating the performance, such as the type marking (2. Typecode), rated voltage (3. Rated voltage) and rated current (4. Rated current). According to the invention the rating plate part 33 is a mechanically separate unit, which can comprise, together with the device frame, fixed mechanical fittings that are compatible with each other and from which there is a data transfer connection to the control unit of the device.

Figure 4A:
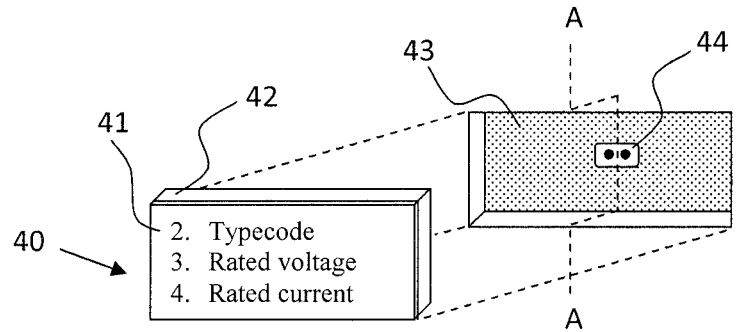
Figure 4B:
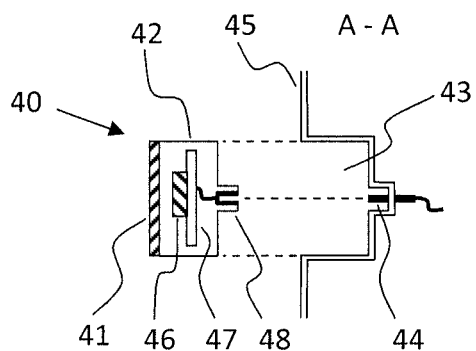
Figure 5:
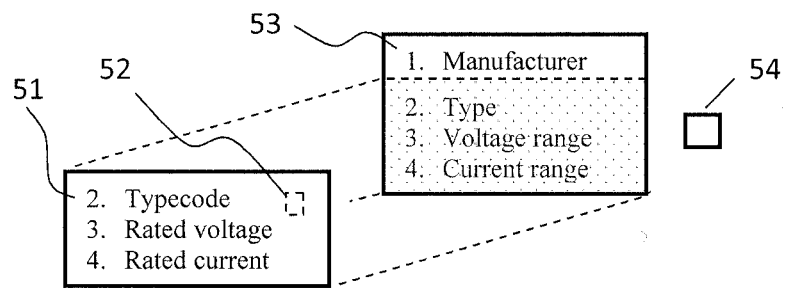

FIGS. 4a and 4b describe in more detail an example of the mechanical fitting to a device of a rating plate part according to the invention. In the arrangement according to this embodiment of the invention, the rating plate part 40 is formed from a rating plate module 42, fabricated e.g. from plastic, and from a rating plate 41 affixed to said module, on which rating plate the values concerning the performance of the device are permanently and visibly recorded in such a way that the values can be read when the rating plate part is affixed to the electronics device, into the disposal location 43 that is intended for the rating plate part and is sunk into the wall 45 of the casing of the device. Inside the module is a mounting base 47, e.g. a circuit board, in the memory means 46, e.g. an EEPROM memory circuit, fixed to which mounting base is recorded the information corresponding to the values stamped in the rating plate part 41 of the nameplate. The information can be transferred to the control unit of the device, according to the embodiment of the figure with a wireline connection, which is formed between the connector parts 44 and 48 when the rating plate module is pressed into its position. This type of device configuration according to the invention therefore requires that the device has on the frame a specific mechanical fitting for the rating plate module. For preventing the incorrect rating plate module—frame combination, the fitting can be frame specific, or information about the permitted performance values for the frame size in question, and about other possible adjustments relating to product variation, can be recorded in the control unit of the device or in the manufacturing process.

Instead of a wireline serial communication connection, in the transfer of information it is possible to use also other methods known to persons skilled in the art, such as e.g. RFID (Radio Frequency IDentification), which is a wireless radio-frequency remote identification method for the remote reading and recording of information using RFID identifiers, i.e. tags. In FIG. 5 is an example of the application of an RFID identifier solution according to this invention. The rating plate part 51 in this case is a strip-shaped sticker, which comprises an antenna (not presented) and a microchip 52 comprising a memory containing the performance values of the device and on the surface of which rating plate part is an area on which the performance values are stamped so as to be permanently visible. The control unit of the device to be configured can read the contents of the microchip 52 wirelessly via a receiver 54 e.g. during commissioning. On the base part 53 of the nameplate can be stamped some of the type marking (2. Type) as well as the performance range (3. Voltage range and 4. Current range) permitted for the device structure in question. This visible performance area of the nameplate remains covered when the rating plate part 51 is glued into its position, but particularly in this embodiment of the invention the permitted performance range must be recorded during the manufacturing process also in the control unit of the device, for preventing the incorrect performance—frame combination, because the rating plate part 51 to be glued into connection with this type of configuration method typically does not require any frame-specific mechanical fitting.

When the device has read the data recorded in the memory means of the rating plate part connected to it, it can set, i.e. configure, its own performance values to be according to the data read. In one embodiment of the invention the device can, after setting the performance values, lock its own performance values in such a way that they can no longer be changed afterwards.

It is obvious to the person skilled in the art that the different embodiments of the invention are not limited solely to the example described above, but that they may be varied within the scope of the claims presented below.

The invention claimed is:

1. Arrangement for connecting set values concerning performance to an electronics device, more particularly to a power electronics device, a frequency converter, which arrangement comprises a rating plate part comprising:
   the rating plate part is a separate unit belonging to a nameplate arrangement of the electronics device, which unit is adapted to be affixed to the electronics device, and
   the rating plate part comprises a memory means, an EEPROM memory circuit, in which values concerning the performance of the electronics device are recorded, and
   the rating plate part further comprises an area in which information corresponding to the values concerning performance that are recorded in memory are permanently registered in such a way that this information remains visible when the rating plate part is affixed to the electronics device,
   wherein the rating plate part further comprises a communication means for the digital data transfer occurring with the electronics device, by the aid of which communication means the values concerning performance that relate to the electronics device is transferred from the rating plate part to the electronics device.

2. Arrangement according to claim 1, wherein data transfer between the communication means of the rating plate part and the electronics device is adapted to be performed via a wireline or wireless connection.

3. Arrangement according to claim 2, wherein the electronics device, in connection with which the rating plate part has been disposed, comprises a communication means, which is adapted to read or to receive the values contained by the memory means of the rating plate part.

4. Arrangement according to claim 2, wherein the arrangement is adapted to use in the data transfer between the rating plate part and the electronics device an encryption algorithm, which prevents the reading of the data with communication means other than those belonging to the system.

5. Arrangement according to claim 2, wherein the electronics device, in connection with which the rating plate part has been disposed, is adapted to adjust its own performance values to be according to the definitions it reads from the memory means.

6. Arrangement according to claim 2, wherein the electronics device is adapted to adjust its own performance values to be permanently according to the definitions it reads from the rating plate part in such a way that after reading them they can no longer be changed.

7. Arrangement according to claim 1, wherein the electronics device, in connection with which the rating plate part has been disposed, comprises a communication means, which is adapted to read or to receive the values contained by the memory means of the rating plate part.

8. Arrangement according to claim 7, wherein the arrangement is adapted to use in the data transfer between the rating plate part and the electronics device an encryption algorithm, which prevents the reading of the data with communication means other than those belonging to the system.

9. Arrangement according to claim 7, wherein the electronics device, in connection with which the rating plate part has been disposed, is adapted to adjust its own performance values to be according to the definitions it reads from the memory means.

10. Arrangement according to claim 1, wherein the arrangement is adapted to use in the data transfer between the rating plate part and the electronics device an encryption algorithm, which prevents the reading of the data with communication means other than those belonging to the system.

11. Arrangement according to claim 10, wherein the electronics device, in connection with which the rating plate part has been disposed, is adapted to adjust its own performance values to be according to the definitions it reads from the memory means.

12. Arrangement according to claim 1, wherein the electronics device, in connection with the rating plate part has been disposed, is adapted to adjust its own performance values to be according to the definitions it reads from the memory means.

13. Arrangement according to claim 1, wherein the electronics device is adapted to adjust its own performance values to be permanently according to the definitions it reads from the rating plate part-in such a way that after reading them they can no longer be changed.

14. Arrangement according to claim 1, wherein the arrangement further comprises a device frame of the electronics device and a control unit and
   the permitted performance range for the electronics device is recorded in the control unit of the electronics device, and
   the control unit is adapted to accept as its own performance values only those performance values read from the rating plate part that fall within the permitted performance range for the device frame.

15. Arrangement according to claim 1, wherein the arrangement comprises mechanical fittings on the electronics device and on the rating plate part that are compatible with each other and are adapted to affix the rating plate part permanently to a disposal location sunk into the wall of the electronics device.

16. Arrangement according to claim 1, wherein the arrangement further comprises connector parts and a data transfer connection forms between the electronics device and the rating plate part by means of the connector parts when the rating plate part is installed into its position.

17. Arrangement according to claim 1, wherein the rating plate part comprises a mounting base, e.g. a circuit board, to which the memory means, an EEPROM memory circuit, is fixed.

18. Arrangement according to claim 1, wherein the rating plate part is a remotely readable sticker, an RFID identifier, comprising an antenna and a memory, which sticker is adapted to be glued to the electronics device.

19. Arrangement according to claim 1, wherein the values concerning the performance of the electronics device that are contained by a rating plate part, which values remain visible when the rating plate part is affixed to the electronics device, are visibly marked on the outer surface of the rating plate part by stamping, printing or impressing.

20. Arrangement according to claim 1, wherein a value relating to the performance of the electronics device is the type marking, rated voltage or rated current of the device.

* * * * *